(12) United States Patent
Cheng et al.

(10) Patent No.: US 11,709,211 B2
(45) Date of Patent: Jul. 25, 2023

(54) POWER CALCULATION METHOD OF MAGNETIC CIRCUIT

(71) Applicant: SOUTHEAST UNIVERSITY, Jiangsu (CN)

(72) Inventors: Ming Cheng, Jiangsu (CN); Zheng Wang, Jiangsu (CN); Xinkai Zhu, Jiangsu (CN); Wei Qin, Jiangsu (CN)

(73) Assignee: SOUTHEAST UNIVERSITY, Jiangsu (CN)

( * ) Notice: Subject to any disclaimer, the term of this patent is extended or adjusted under 35 U.S.C. 154(b) by 70 days.

(21) Appl. No.: 17/609,703

(22) PCT Filed: Jan. 22, 2021

(86) PCT No.: PCT/CN2021/073268
§ 371 (c)(1),
(2) Date: Nov. 8, 2021

(87) PCT Pub. No.: WO2022/110528
PCT Pub. Date: Jun. 2, 2022

(65) Prior Publication Data
US 2022/0373621 A1 Nov. 24, 2022

(30) Foreign Application Priority Data
Nov. 26, 2020 (CN) .......................... 202011350267.5

(51) Int. Cl.
*G01R 33/12* (2006.01)
*G01R 21/133* (2006.01)
(52) U.S. Cl.
CPC ..... *G01R 33/1253* (2013.01); *G01R 21/1331* (2013.01)

(58) Field of Classification Search
CPC ............... G01R 33/12; G01R 33/1253; G01R 21/1331; G01R 21/002; G01R 21/003; Y02E 60/00; G06F 17/10
See application file for complete search history.

(56) References Cited

U.S. PATENT DOCUMENTS

| 4,393,157 | A | * | 7/1983 | Roberge | .................. | H01F 21/08 |
| | | | | | | 323/355 |
| 8,564,281 | B2 | * | 10/2013 | Filatov | .................. | G01B 7/003 |
| | | | | | | 324/207.17 |

(Continued)

FOREIGN PATENT DOCUMENTS

| BR | MU 8900816 U2 * | 1/2011 | ............... H02H 3/08 |
| CN | 104239652 A | 12/2014 | |

(Continued)

OTHER PUBLICATIONS

Chai Feng, "Theoretical Analysis and Calculation of Eddy Losses in Stator Windings of Large Synchronous Generator", China Master's Theses Full-text Database(CMFD) Engineering Technology Series II, Mar. 15, Mar. 15, 2010) the 3rd issue ISSN:1674-0246 C042-24-Abstract, main body p. 50-51, 76 pages.

(Continued)

*Primary Examiner* — Tung S Lau
(74) *Attorney, Agent, or Firm* — Muncy, Geissler, Olds & Lowe, P.C.

(57) ABSTRACT

Disclosed is a power calculation method of a magnetic circuit. In view of the power problem of a magnetic circuit and the phase problem of a magnetomotive force (MMF) and a magnetic flux in the magnetic circuit, the present disclosure draws a magnetic circuit vector diagram based on an equivalent magnetic circuit vector model, and provides a method for calculating virtual magnetic active power, virtual magnetic reactive power, and virtual magnetic complex power of the magnetic circuit by analyzing the MMF, the (Continued)

magnetic flux, the reluctance, and the magnetic reactance in the magnetic circuit by using the magnetic circuit vector diagram. A mathematical relationship between the virtual magnetic power of the magnetic circuit and the electric power of the corresponding equivalent electric circuit is derived according to a conversion factor between the virtual magnetic power and the electric power, so that the electric power can be directly calculated according to magnetic parameters such as the MMF and the magnetic flux in the magnetic circuit. The power calculation method of the magnetic circuit provided in the present disclosure can calculate and analyze the virtual magnetic power of the magnetic circuit according to the magnetic circuit vectors, so as to calculate the electric power from the magnetic circuit through conversion. The electric power can be solved according to the magnetic circuit vectors directly when the electric vectors are not available to calculate electric power in electromagnetic components.

8 Claims, 3 Drawing Sheets

(56) References Cited

U.S. PATENT DOCUMENTS

| | | | |
|---|---|---|---|
| 2007/0285195 A1 * | 12/2007 | Nehl | H01F 7/1844 335/209 |
| 2009/0064060 A1 | 3/2009 | Yoshitomi | |
| 2013/0057099 A1 * | 3/2013 | Murray, III | H02K 1/246 310/179 |

FOREIGN PATENT DOCUMENTS

| | | | | |
|---|---|---|---|---|
| CN | 104701845 A | | 6/2015 | |
| CN | 105826950 A | | 8/2016 | |
| CN | 106908745 A | | 6/2017 | |
| CN | 107153746 A | | 9/2017 | |
| CN | 108494186 A | | 9/2018 | |
| CN | 110174544 A | | 8/2019 | |
| CN | 110188418 A | | 8/2019 | |
| CN | 111566917 A | | 8/2020 | |
| EP | 0010502 B1 | * | 7/1985 | ............ H01F 21/08 |
| EP | 2761318 A1 | | 8/2014 | |
| JP | 2449697 03 | * | 8/1989 | ............ H01F 29/10 |
| JP | 2001-516199 A | * | 9/2001 | .............. H01F 7/18 |
| JP | 2006-337040 A | * | 12/2006 | ............ G01N 27/83 |
| KR | 10-0981194 B1 | * | 9/2010 | ............ H01F 27/28 |
| SE | 511 217 C2 | * | 8/1999 | ............ H02P 25/089 |
| WO | WO 2005/076293 A1 | * | 8/2005 | .............. H02M 5/10 |
| WO | WO 2014/021912 A1 | * | 2/2014 | ........... H02K 19/103 |

OTHER PUBLICATIONS

Zhou E et al., Magnetic circuit analysis and parameter calculation of a new type of reluctance motor, Science in China(Series A, mathematics, physics, astronomy, technical science) Jun. 30, 1983(Jun. 30, 1983) the 6th issue ISSN:1674-7216 p. 571-580, 11 pages.

Zhang Wenjuan, The Design of Tubular Linear Induction Motor for Lifting and Analusis of Its Starting Characteristics, China Master's Theses Full-text Database(CMFD) Engineering Technology Series II, Mar. 15, 2010(Mar. 15, 2010) the 3rd issue ISSN:1674-0246 p. C042-66, 70 pages.

XU Yan et al., A Novel Inductance Calculation Method in Power Transformer Model Based on Magnetic Circuit TENCON 2005-2005 IEEE Region 10 Conference Feb. 5, 2007(Feb. 5, 2007) ISSN:2159-2450 p. 1-4, 4 pages.

* cited by examiner

POWER CALCULATION METHOD OF MAGNETIC CIRCUIT

TECHNICAL FIELD

The present disclosure relates to the field of magnetic circuit theory and applications, and particularly to calculation and analysis of power of a magnetic circuit.

BACKGROUND

As electrification and computer technologies advance, various novel strong electromagnetic coupling devices such as motors, transformers, and wireless charging apparatus with different structural characteristics, different working principles, and different performance advantages have recently emerged in large numbers. Currently, early design of the novel electromagnetic devices mainly relies on Maxwell's equations to perform two-dimensional or three-dimensional finite element analysis, which is computationally complicated, time-consuming, and costly. Magnetic circuit theory is a magnetic circuit analysis method established by corresponding to electric circuit theory, and serves as one of important theories in electromagnetics. Under specific circumstances, an equivalent magnetic circuit may be described by corresponding to a mathematical formula for a classical principle such as Kirchhoff's law or Ohm's law in the electric circuit theory. In practical problems, the magnetic circuit analysis method may be used to analyze magnetic fields of the electromagnetic devices. This simplifies complex and abstract practical analysis problems to simple and theoretical mathematical logical descriptions, so as to reduce the design time of the electromagnetic devices, thereby saving the design costs. Therefore, the magnetic circuit analysis method has gradually attracted the attentions of relevant researchers.

Researches on the magnetic circuit analysis method in China began in the 1980s. Experts in relevant fields of universities and research institutions in China have obtained many research achievements in this regard. Renyuan Tang, an academician of the Chinese Academy of Engineering, put forward a basic principle of a magnetic circuit of a permanent magnet motor in the "Modern Permanent Magnet Motor Theory and Design". The magnetic circuit method has a high calculation speed, but has a relatively low calculation accuracy. In practical applications, calculation results are often corrected with some correction coefficients derived from engineering experience. Vlado Ostovic, a former Yugoslav scholar, put forward a numerical calculation method of a dynamic magnetic network model based on a summary of a plurality of classical magnetic circuit theories. In 1999, the scholar successfully applied a three-dimensional dynamic magnetic network method to claw-pole alternators. Xiaogang Chen and other scholars at Zhejiang University put forward a magnetic network model of a permanent magnet synchronous motor, and verified the rapidity of a dynamic magnetic network method on the built model. With the popularization of commercial finite element software such as ANSOFT and JAMG, the magnetic circuit analysis method has been increasingly applied to three-dimensional electromagnetic analysis and structural analysis of electromagnetic equipment, for example, novel electromagnetic devices such as wireless power transmission device models, magnetic flux switching motor models, and high-frequency transformer models.

Ming Cheng and other scholars at Southeast University put forward a hybrid analysis method that combines the magnetic circuit analysis method and a two-dimensional finite element method, and applied the hybrid analysis method to study the effect of axial segmentation of a permanent magnet on an eddy current loss. The magnetic circuit analysis method makes up for the deficiencies of the finite element method in principle. During an application of the existing magnetic circuit analysis method or magnetic network analysis method, the magnetomotive force (MMF) and the magnetic flux of a magnetic circuit are analyzed and calculated according to Ohm's law and Kirchhoff's law for magnetic circuit, with no consideration of the power problem of the magnetic circuit. No attention has been paid to calculation and analysis of power in the magnetic circuit. Moreover, the existing magnetic circuit analysis method models the magnetic circuit by using magnetic circuit elements such as a linear permeance, a nonlinear permeance, a permanent MMF, and a winding MMF, without considering a phase relationship between the MMF and the magnetic flux in the magnetic circuit.

SUMMARY

A technical problem to be solved by the present invention is to provide a power calculation method of a magnetic circuit in view of the power problem of the magnetic circuit and the phase problem of the MMF and the magnetic flux in the magnetic circuit. A magnetic circuit vector diagram is drawn according to the MMF, the magnetic flux, the reluctance, and the magnetic reactance in the magnetic circuit, and the virtual magnetic power of the magnetic circuit is calculated. A mathematical relationship between the virtual magnetic power of the magnetic circuit and the electric power of the corresponding equivalent electric circuit is derived according to a conversion factor between the virtual magnetic power and the electric power of the magnetic circuit, so that the electric power can be directly calculated according to magnetic parameters such as the MMF and the magnetic flux in the magnetic circuit.

The technical solutions adopted by the present disclosure are as follows:

The present disclosure provides a power calculation method of a magnetic circuit, including:

S1. calculating, in a case that a to-be-measured magnetic circuit is in a stable operation, an MMF $\dot{F}$ and a magnetic flux $\dot{\Phi}$, in the magnetic circuit;

S2. solving a magnetic impedance value $Z_{mc}$ and a magnetic impedance angle $h\varphi_{mc}$ of the magnetic circuit according to a formula $$\frac{\dot{F}}{\dot{\Phi}} = Z_{mc} \angle \varphi_{mc};$$

S3. solving a reluctance value, a magnetic reactance value, and a magnetic-inductance value of the magnetic circuit respectively according to calculation formulas:

$$R_{mc} = Z_{mc} \cos \varphi_{mc}, X_{mc} = Z_{mc} \sin \varphi_{mc}, \text{ and } X_{mc} = \omega L_{mc};$$

where $R_{mc}$ represents the reluctance value of the magnetic circuit, $X_{mc}$ represents the magnetic reactance value of the magnetic circuit, $L_{mc}$ represents the magnetic-inductance value of a magnetic-inductance component, and $\omega$ represents an angular frequency of the magnetic flux varied in the magnetic circuit;

S4. selecting a reference coordinate system, and drawing a magnetic circuit vector diagram;

S5. performing an orthogonal decomposition on the MMF $\dot{F}$ in the magnetic circuit with respect to the magnetic flux $\dot{\Phi}$ according to the magnetic circuit vector diagram, to obtain a magnetic voltage drop $\dot{F}_1$ along a direction of the magnetic flux, and a magnetic voltage drop $\dot{F}_2$ along a direction perpendicular to the direction of the magnetic flux;

S6. calculating virtual magnetic active power of the magnetic circuit according to a formula $P_{mc}=\|\dot{F}_2\|\cdot\|\dot{\Phi}\|$, and calculating virtual magnetic reactive power of the magnetic circuit according to a formula $Q_{mc}=\|\dot{F}_1\|\cdot\|\dot{\Phi}\|$;

S7. solving virtual magnetic complex power $\dot{S}_{mc}$ of the magnetic circuit according to formulas:

$$\dot{S}_{mc} = \|\dot{S}_{mc}\| \angle \varphi_{mc}, \ \|\dot{S}_{mc}\| = \sqrt{P_{mc}^2 + Q_{mc}^2}, \text{ and } \varphi_{mc} = \arctan\left(\frac{P_{mc}}{Q_{mc}}\right);$$

S8. solving corresponding electric power according to a conversion factor $d\dot{\Phi}/\dot{\Phi}dt)$ between the virtual magnetic power of the magnetic circuit and corresponding electric power of an electric circuit, the conversion factor being $j\omega$ in a case that the MMF and the magnetic flux in the magnetic circuit are sinusoidal, namely:

electric active power $P_e=\omega P_{mc}$, electric reactive power $Q_e=\omega Q_{mc}$, and electric complex power $\dot{S}=j\omega \dot{S}_{mc}$.

Further, the power calculation method of the magnetic circuit provided in the present disclosure further includes, before calculating the virtual magnetic active power and the virtual magnetic reactive power of the magnetic circuit in S6, verifying whether a magnetic circuit topology including the magnetic-inductance component satisfies magnetic circuit Ohm's law, namely:

$$\dot{F}=(R_{mc}+j\omega L_{mc})\dot{\Phi};$$

where j represents an imaginary unit, $R_{mc}$ represents the reluctance value of the magnetic circuit, $\omega$ represents the angular frequency of the magnetic flux varied in the magnetic circuit, $L_{mc}$ represents the magnetic-inductance value of the magnetic-inductance component, $\dot{\Phi}$ represents the magnetic flux in the magnetic circuit, and $\dot{F}$ represents the MMF in the magnetic circuit.

Further, in the power calculation method of the magnetic circuit provided in the present disclosure, a magnitude of the magnetic-inductance value $L_{mc}$ of the magnetic-inductance component is related with a winding number $N_t$ of a short-circuited coil and a resistance value $R_t$ of the short-circuited coil, namely $$L_{mc} = \frac{N_r^2}{R_r},$$

and magnetic-inductance is measured in $\Omega^{-1}$. The magnetic-inductance component has an obstructive effect on an alternating magnetic flux, but has no obstructive effect on a constant magnetic flux, and an expression for the magnetic reactance value is defined as $X_{mc}=\omega L_{mc}$, to describe the degree of the obstructive effect of the magnetic-inductance component on the alternating magnetic flux, $\omega$ being the angular frequency of the magnetic flux varied in the magnetic circuit.

Further, in the power calculation method of the magnetic circuit provided in the present disclosure, an equivalent magnetic circuit vector model includes such four magnetic circuit lumped variables as the MMF $\dot{F}$, the magnetic flux $\dot{\Phi}$, the reluctance $R_{mc}$, and the magnetic-inductance $L_{mc}$.

According to the equivalent magnetic circuit vector model, a constructed electromagnetic vector diagram is capable of simultaneously showing phase relationships between electric circuit vectors and magnetic circuit vectors, in a case of linking the equivalent magnetic circuit vector model and an equivalent electric circuit model by using vectors.

Further, in the power calculation method of the magnetic circuit provided in the present disclosure, with reference to the magnetic circuit vector diagram, an expression for the virtual magnetic complex power of the magnetic circuit is $\dot{S}_{mc}=\dot{\Phi}\cdot\dot{F}^*=\|\dot{F}\|\cdot\|\dot{\Phi}\|e^{-j\varphi_{mc}}=R_{mc}\|\dot{\Phi}\|^2-j\omega L_{mc}\|\dot{\Phi}\|^2=Q_{mc}-jP_{mc}$.

Further, in the power calculation method of the magnetic circuit provided in the present disclosure, the virtual magnetic active power of the magnetic circuit is defined as an imaginary part of the virtual magnetic complex power. With reference to the magnetic circuit vector diagram an expression for the virtual magnetic active power of the magnetic circuit is $P_{mc}=\|\dot{F}\|\cdot\|\dot{\Phi}\| \sin \varphi_{mc}=\|\dot{F}_2\|\cdot\|\dot{\Phi}\|=X_{mc}\|\dot{\Phi}\|^2=\omega L_{mc}\|\dot{\Phi}\|^2$.

Further, in the power calculation method of the magnetic circuit provided in the present disclosure, the virtual magnetic reactive power of the magnetic circuit is defined as a real part of the virtual magnetic complex power. With reference to the magnetic circuit vector diagram, an expression for the virtual magnetic reactive power of the magnetic circuit is $Q_{mc}=\|\dot{F}\|\cdot\|\dot{\Phi}\| \cos \varphi_{mc}=\|\dot{F}_1\|\cdot\|\dot{\Phi}\|=R_{mc}\|\dot{\Phi}\|^2$.

Further, in the power calculation method of the magnetic circuit provided in the present disclosure, the conversion factor between the virtual magnetic power and the electric power of the magnetic circuit is $d\dot{\Phi}/(\dot{\Phi}dt)$. The conversion factor is $j\omega$ in a case that the MMF and the magnetic flux in the magnetic circuit are sinusoidal, namely:

An expression for the electric active power is:

$$P_e=\omega P_{mc}=\omega\|\dot{F}\|\cdot\|\dot{\Phi}\| \sin \varphi_{mc}=\omega\|\dot{F}_2\|\|\dot{\Phi}\|=\omega X_{mc}\|\dot{\Phi}\|^2=\omega^2 L_{mc}\|\dot{\Phi}\|^2.$$

An expression for the electric reactive power is:

$$Q_e=\omega Q_{mc}=\omega\|\dot{F}\|\cdot\|\dot{\Phi}\| \cos \varphi_{mc}=\omega\|\dot{F}_1\|\cdot\|\dot{\Phi}\|=\omega R_{mc}\|\dot{\Phi}\|^2.$$

An expression for the electric complex power is $\dot{S}_a=j\omega\dot{S}_{mc}=\omega P_{mc}+j\omega Q_{mc}=P_e+jQ_e$. The present disclosure adopts the foregoing technical solution, and has the following beneficial effects as compared with the related art:

1. The power calculation method of the magnetic circuit provided in the present disclosure can calculate and analyze the virtual magnetic power of the magnetic circuit according to the magnetic circuit vectors, so as to calculate the electric power from the magnetic circuit through conversion. The electric power can be solved according to the magnetic circuit vectors directly when electric vectors are not available to calculate electric power, which provides a new solution to calculation and analysis of the power in electromagnetic components.

2. The magnetic circuit vector diagram provided in the present disclosure can clearly show amplitude and phase relationships between vectors in the magnetic circuit. In this way, the magnetic circuit vectors can be synthesized and decomposed in any direction, to effectively represent a virtual magnetic active component and a virtual magnetic reactive component of the magnetic circuit vector, which makes it convenient for researchers to analyze and calculate the magnetic circuit.

3. The magnetic circuit vector diagram provided in the present disclosure may be drawn according to a design requirement for actual power of the magnetic circuit. The magnitude and direction of the magnetic circuit vector may be purposefully changed by changing the virtual magnetic active component or the virtual magnetic reactive component of the magnetic circuit vector, thereby changing the electric active power or the electric reactive power of the magnetic circuit.

DETAILED DESCRIPTION

The technical solutions in the present disclosure are described in detail below with reference to the accompanying drawings.

The present disclosure provides a power calculation method of a magnetic circuit, whose core content is as follows: Based on an equivalent magnetic circuit vector model, an MMF, a magnetic flux, a reluctance, and a magnetic reactance of a magnetic circuit are analyzed by using a provided magnetic circuit vector diagram, so as to provide a method for calculating virtual magnetic active power, virtual magnetic reactive power, and virtual magnetic complex power in the magnetic circuit, which correspond to active power, reactive power, and complex power in an electric circuit. The electric power of the magnetic circuit is calculated through conversion according to the virtual magnetic power of the magnetic circuit with reference to a provided conversion factor.

Figure 1:
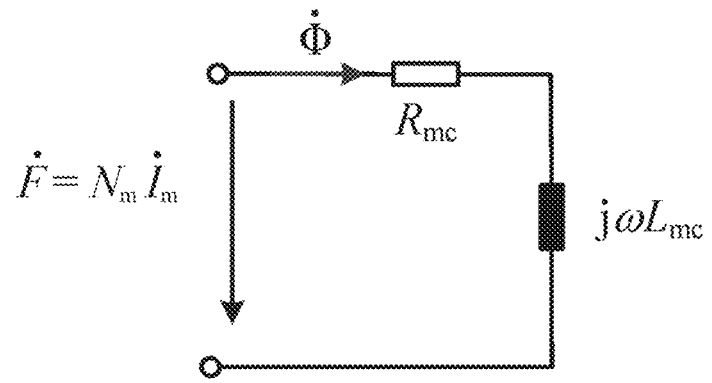
FIG. 1 shows an equivalent magnetic circuit vector model according to the present disclosure.

The equivalent magnetic circuit vector model includes such four magnetic circuit lumped variables as an MMF $\dot{F}$, a magnetic flux $\dot{\Phi}$, a reluctance $R_{mc}$, and a magnetic-inductance $L_{mc}$, which correspond to such four electric circuit lumped variables as a voltage $\dot{U}$, a current $\dot{I}$, a resistance $R$, and an inductance $L$ in an equivalent electric circuit vector model, namely $\dot{F}=(R_{mc}+j\omega L_{mc})\dot{\Phi}$. The equivalent magnetic circuit vector model is shown as in FIG. 1.

In the equivalent magnetic circuit vector model, a calculation formula of the MMF $\dot{F}$ is $\dot{F}=N_m \dot{I}_m$, ampere-turn being the unit of the MMF, $N_m$ being a winding number of an exciting coil, and $\dot{I}_m$ being a current in the exciting coil. The magnetic flux in the magnetic circuit satisfies $$\dot{\Phi} = \frac{\dot{F}}{(R_{mc} + j\omega L_{mc})}.$$

The reluctance in the magnetic circuit indicates a constant resistance effect of the magnetic circuit on the magnetic flux, which resists both an alternating magnetic flux and a constant magnetic flux. In a case of a constant MMF, a reluctance in the magnetic circuit including no magnetic-inductance component may change the magnitude of the magnetic flux, but does not change the phase of the magnetic flux. As an exciting frequency of the magnetic circuit increases, the reluctance value of the magnetic circuit increases accordingly due to a skin effect of the magnetic flux. As the magnetic flux of the magnetic circuit increases, the reluctance value of the magnetic circuit also increases due to saturation of the magnetic circuit.

Further, the magnetic-inductance $L_{mc}$ inhibits the variation of the magnetic flux in the magnetic circuit. The magnetic-inductance has an obstructive effect on the alternating magnetic flux but no obstructive effect on the constant magnetic flux. A calculation formula of the magnetic-inductance component is $$L_{mc} = \frac{N_r^2}{R_r},$$

$N_r$ being a winding number of the magnetic-inductance component, and $R_r$ being a resistance value of the magnetic-inductance component. In order to describe the obstructive effect of the magnetic-inductance on the alternating magnetic flux, an expression for the magnetic reactance is defined as $X_{mc}=\omega L_{mc}$, $\omega$ being an angular frequency of the magnetic flux varied in the magnetic circuit.

A magnetic impedance value in the magnetic circuit may be calculated according to $Z_{mc}=\sqrt{R_{mc}^2+X_{mc}^2}$. A magnetic impedance angle in the magnetic circuit may be calculated according to $\varphi_{mc}=\arctan(\omega L_{mc}/R_{mc})$. The reluctance value satisfies a formula $R_{mc}=Z_{mc} \cos \varphi_{mc}$. The magnetic reactance value satisfies a formula $X_{mc}=Z_{mc} \sin \varphi_{mc}$.

Figure 2:
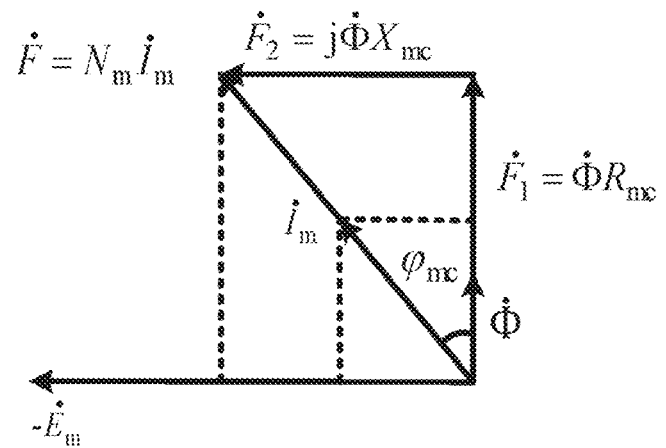
FIG. 2 shows a magnetic circuit vector diagram according to the present disclosure.

Further, according to the equivalent magnetic circuit vector model, a magnetic circuit vector diagram may be drawn as shown in FIG. 2, $\dot{E}_m$ representing an opposing electromotive force on the exciting coil. An orthogonal decomposition is performed on the MMF along a direction of the magnetic flux $\dot{\Phi}$ and a direction perpendicular to the direction of the magnetic flux $\dot{\Phi}$, so as to obtain a magnetic voltage drop (corresponding to a virtual magnetic reactive component) on the reluctance as $\dot{F}_1=\dot{\Phi}R_{mc}$, and a magnetic voltage drop (corresponding to a virtual magnetic active component) on the magnetic-inductance as $\dot{F}_2=j\dot{\Phi}X_{mc}$. In addition, $\dot{F}=\dot{F}_1+\dot{F}_2$ is satisfied.

According to the provided equivalent magnetic circuit vector model, a constructed electromagnetic vector diagram can simultaneously show phase relationships between electric circuit vectors and magnetic circuit vectors, in a case of linking the equivalent magnetic circuit model and an equivalent electric circuit model by using vectors (such as a magnetic flux vector).

With reference to the magnetic circuit vector diagram, an expression for the virtual magnetic complex power of the magnetic circuit is:

$$\dot{S}_{mc}=\dot{\Phi}\cdot\dot{F}^*=\|\dot{F}\|\cdot\|\dot{\Phi}\|e^{-j\varphi_{mc}}=R_{mc}\|\dot{\Phi}\|^2-j\omega L_{mc}\|\dot{\Phi}\|^2=Q_{mc}-jP_{mc}.$$

The virtual magnetic active power of the magnetic circuit is defined as an imaginary part of the virtual magnetic complex power and an expression for the virtual magnetic active power of the magnetic circuit is $P_{mc}=\|\dot{F}\|\cdot\|\dot{\Phi}\| \sin \varphi_{mc}=\|\dot{F}_2\|\cdot\|\dot{\Phi}\|=X_{mc}\|\dot{\Phi}\|^2=\omega L_{mc}\|\dot{\Phi}\|^2$. The virtual magnetic reactive power of the magnetic circuit is defined as a real part of the virtual magnetic complex power, and an expression for the virtual magnetic reactive power of the magnetic circuit is $Q_{mc}=\|\dot{F}\|\cdot\|\dot{\Phi}\| \cos \varphi_{mc}=\|\dot{F}_1\|\cdot\|\dot{\Phi}\|=R_{mc}\|\dot{\Phi}\|^2$.

The virtual magnetic power of the magnetic circuit satisfies the following relationships, namely, $\|\dot{S}_{mc}\| = \sqrt{P_{mc}^2 + Q_{mc}^2}$, and $$\varphi_{mc} = \arctan\left(\frac{P_{mc}}{Q_{mc}}\right).$$

A conversion factor between the virtual magnetic power and electric power of the magnetic circuit is $d\dot{\Phi}(\dot{\Phi}dt)$. In particular, the conversion factor is $j\omega$ in a case that the MMF and the magnetic flux in the magnetic circuit are sinusoidal.

An expression for the electric active power is:

$P_e = \omega P_{mc} = \omega \|\dot{F}\| \cdot \|\dot{\Phi}\| \sin \varphi_{mc} = \omega \|\dot{F}_2\| \cdot \|\dot{\Phi}\| = \omega X_{mc} \|\dot{\Phi}\|^2 = \omega^2 L_{mc} \|\dot{\Phi}\|^2$.

An expression for the electric reactive power is:

$Q_e = \omega Q_{mc} = \omega \|\dot{F}\| \cdot \|\dot{\Phi}\| \cos \varphi_{mc} = \omega \|\dot{F}_1\| \cdot \|\dot{\Phi}\| = \omega R_{mc} \|\dot{\Phi}\|^2$.

An expression for the electric complex power is:

$\dot{S}_e = j\omega \dot{S}_{mc} = \omega P_{mc} + j\omega Q_{mc} = P_e + jQ_e$.

Based on the foregoing equivalent magnetic circuit vector model, a specific process of a power calculation method of a magnetic circuit provided in the present disclosure is as follows:

S1. Calculate, in a case that a to-be-measured magnetic circuit is in a stable operation, an MMF $\dot{F}$ and a magnetic flux $\dot{\Phi}$ in the magnetic circuit.

S2. Solve a magnetic impedance value $Z_{mc}$ and a magnetic impedance angle $\varphi_{mc}$ of the magnetic circuit according to a formula $$\frac{\dot{F}}{\dot{\Phi}} = Z_{mc} \angle \varphi_{mc}.$$

S3. Solve a reluctance value of the magnetic circuit according to a formula $R_{mc} = Z_{mc} \cos \varphi_{mc}$, solve a magnetic reactance value of the magnetic circuit according to a formula $X_{mc} = Z_{mc} \sin \varphi_{mc}$, and solve a magnetic-inductance value of the magnetic circuit according to a formula $X_{mc} = \omega L_{mc}$.

S4. Select a reference coordinate system, and draw a magnetic circuit vector diagram.

S5. Perform an orthogonal decomposition on the MMF $\dot{F}$ in the magnetic circuit with respect to the magnetic flux $\dot{\Phi}$ according to the magnetic circuit vector diagram, to obtain a magnetic voltage drop $\dot{F}_1$ corresponding to a virtual magnetic reactive component along a direction of the magnetic flux, and a magnetic voltage drop $\dot{F}_2$ corresponding to a virtual magnetic active component along a direction perpendicular to the direction of the magnetic flux.

S6. Calculate virtual magnetic active power of the magnetic circuit according to a formula $P_{mc} = \|\dot{F}_2\| \cdot \|\dot{\Phi}\|$, and calculate virtual magnetic reactive power of the magnetic circuit according to a formula $Q_{mc} = \|\dot{F}_1\| \cdot \|\dot{\Phi}\|$.

S7. Solve virtual magnetic complex power of the magnetic circuit according to formulas $$\|\dot{S}_{mc}\| = \sqrt{P_{mc}^2 + Q_{mc}^2} \text{ and } \varphi_{mc} = \arctan\left(\frac{P_{mc}}{Q_{mc}}\right).$$

S8. Solve corresponding electric power according to a conversion factor $j\omega$ between the virtual magnetic power and the electric power of the magnetic circuit, namely, $P_e = \omega P_{mc}$, $Q_e = \omega Q_{mc}$, and $\dot{S}_e = j\omega \dot{S}_{mc}$.

Figure 3:
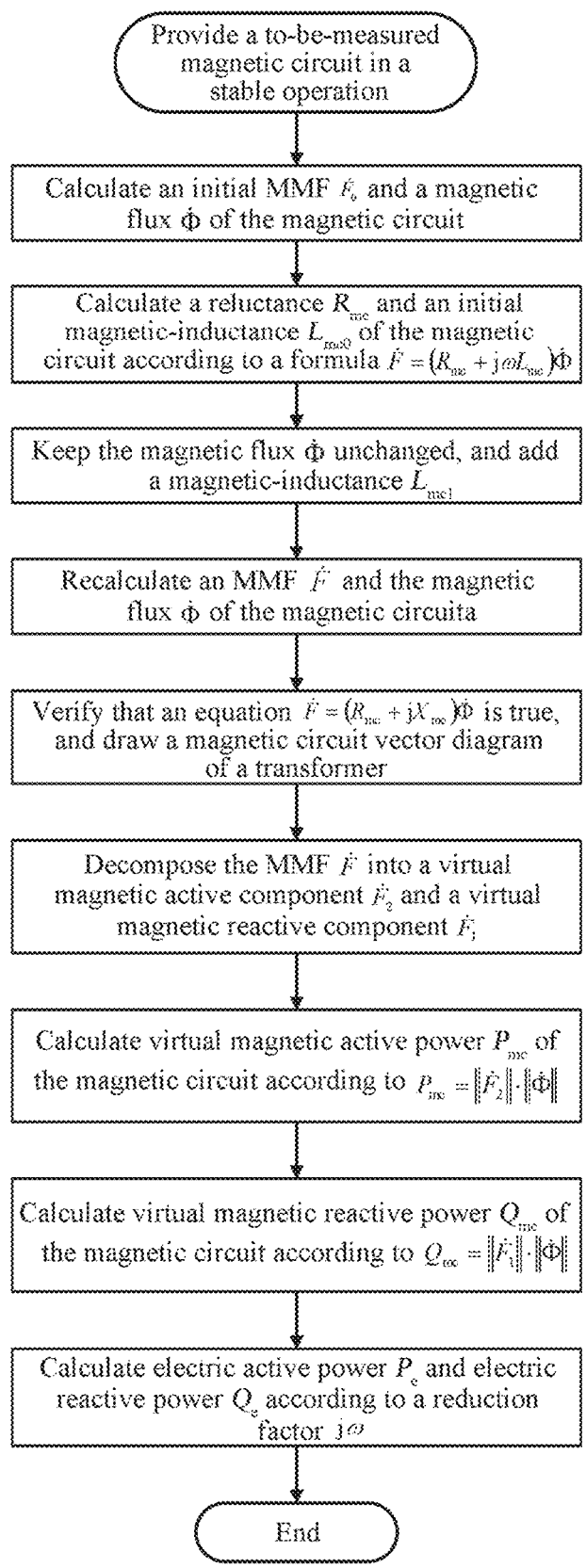
FIG. 3 shows a flowchart of calculating power of a magnetic circuit according to the present disclosure.

In order to calculate the active power and the reactive power of a transformer, a flowchart of a power calculation method of a magnetic circuit is drawn as in FIG. 3. First, in a case that the transformer is running with no load, a reluctance value $R_{mc} = 22343.6$ H$^{-1}$ and an initial magnetic-inductance value $L_{mc0} = 43.34$ $\Omega^{-1}$ of the magnetic circuit are solved according to the formula $\dot{F}_0 = (R_{mc} + j\omega L_{mc0})\dot{\Phi}$. The reluctance value $R_{mc}$ basically remains unchanged, in a case that an exciting frequency of the magnetic circuit and the magnitude of the magnetic flux in the magnetic circuit are kept unchanged.

In a case that an exciting frequency of the magnetic circuit is kept at 50 Hz and the amplitude of the magnetic flux is kept constant, a magnetic-inductance component $L_{md}$ constructed by using a short-circuited coil is added to the magnetic circuit, and a magnetic-inductance value is calculated as 68.353 $\Omega^{-1}$ according to the formula $$L_{mc1} = \frac{N_r^2}{R_r}.$$

In this case, an equivalent magnetic circuit vector model of the transformer has a reluctance of $R_{mc} = 22343.6$ H$^{-1}$ and a magnetic-inductance value of $L_{mc2} = L_{mc0} + L_{mc1} = 111.6$ $\Omega^{-1}$.

Figure 4:
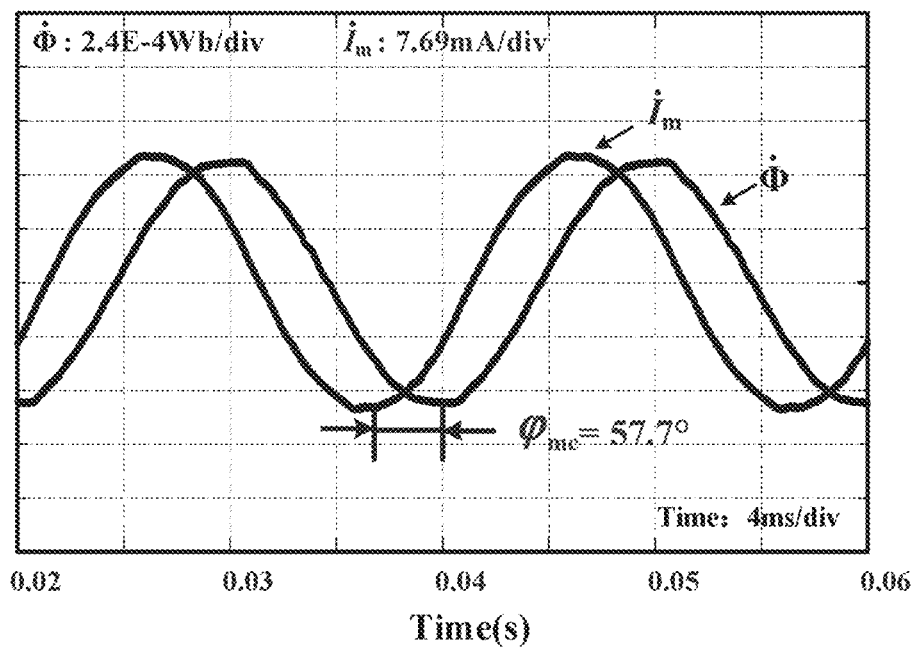
FIG. 4 shows waveforms of the exciting current and the magnetic flux of a to-be-measured magnetic circuit to which a magnetic-inductance component is added.

Waveforms of an exciting current and the magnetic flux of the transformer to which the magnetic-inductance component is added are shown in FIG. 4. According to FIG. 4, the amplitudes and the phases of the MMF vector $\dot{F} = N_m \dot{I}_m$ and the magnetic flux vector $\dot{\Phi}$ of the transformer are calculated. A magnetic impedance value $Z_{mc}$ and a magnetic impedance angle $\varphi_{mc}$ of the magnetic circuit are calculated according to a formula $$\frac{\dot{F}}{\dot{\Phi}} = Z_{mc} \angle \varphi_{mc}.$$

Through calculation, the magnetic impedance value is 41038.6 $\Omega^{-1}$, and the magnetic impedance angle is 57.7°. According to the formula $R_{mc} = Z_{mc} \cos \varphi_{mc}$, the reluctance value may be obtained as 21929.07 H$^{-1}$. According to the formula $\omega L_{mc} = Z_{mc} \sin \varphi_{mc}$, the magnetic-inductance value may be obtained as 110.4165 $\Omega^{-1}$. Therefore, the equation $\dot{F} = (R_{mc} + j\omega L_{mc2})\dot{\Phi}$ is verified to be true.

Figure 5:
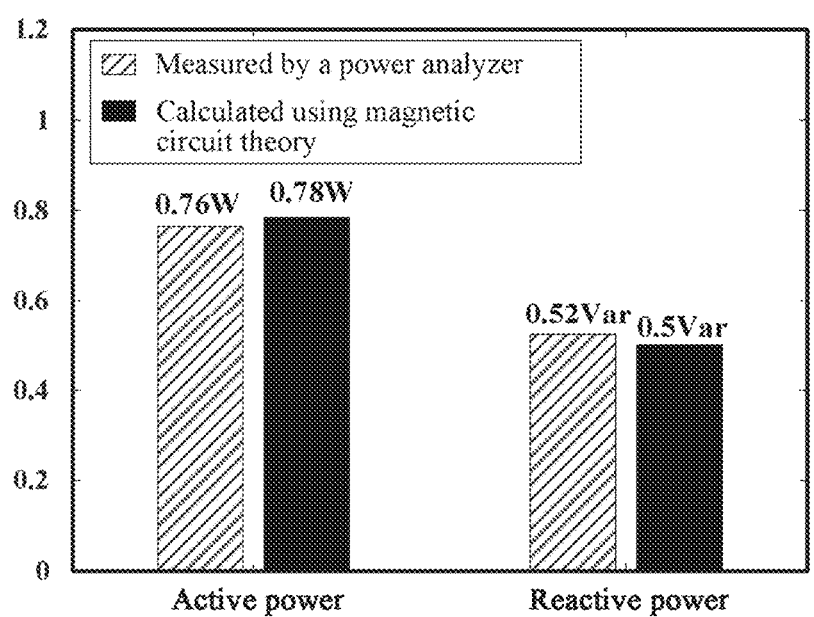
FIG. 5 shows a comparison diagram of actual measured electric power and electric power calculated through conversion by applying the present disclosure.

According to the MMF $\dot{F}$, the magnetic flux $\dot{\Phi}$, the reluctance $R_{mc}$, and the magnetic reactance $X_{mc}$ of the magnetic circuit of the transformer, the vector diagram of the equivalent magnetic circuit model of the transformer may be drawn as shown in FIG. 2, $\dot{E}_m$ representing an opposing electromotive force on an exciting coil. By performing the orthogonal decomposition on the MMF $\dot{F}$ along the direction of the magnetic flux $\dot{\Phi}$ and the direction perpendicular to the direction of the magnetic flux $\dot{\Phi}$, the magnetic voltage drop on the reluctance may be obtained as $\dot{F}_1 = \dot{\Phi} R_{mc}$ and the magnetic voltage drop on the magnetic-inductance may be obtained as $\dot{F}_2 = j\dot{\Phi} X_{mc}$. The virtual magnetic active power of the magnetic circuit is solved according to the formula $P_{mc} = \|\dot{F}_2\| \cdot \|\dot{\Phi}\|$, and the virtual magnetic reactive power of the magnetic circuit is solved according to the formula $Q_{mc} = \|\dot{F}_1\| \cdot \|\dot{\Phi}\|$. Then, according to the conversion factor $j\omega$, the active power of the transformer is calculated as $P_e = \omega P_{mc}$, and the reactive power of the transformer is calculated as $Q_e = \omega Q_{mc}$. The calculated active power $P_e$ of the magnetic circuit is compared with the active power measured by a power analyzer, the calculated reactive power $Q_e$ of the magnetic circuit is compared with the measured reactive power, and the result is shown in FIG. 5. The calculation error of the active power calculated using the magnetic circuit theory is 2.86%, and the calculation error of the reactive power calculated using the magnetic circuit theory is 4%. The result better indicates the correctness and effectiveness of the magnetic circuit calculation method provided in the present disclosure.

In conclusion, the present disclosure provides a power calculation method of a magnetic circuit. The foregoing descriptions are merely exemplary implementations of the present disclosure, and the protection scope of the present disclosure is not limited by the foregoing implementations. A person of ordinary skill in the art may make equivalent modifications or changes according to the contents disclosed by the present disclosure, and such equivalent modifications or changes shall fall within the protection scope recorded in the claims.

What is claimed is:

1. A power calculation method of a magnetic circuit, comprising:
    S1. calculating, in a case that a to-be-measured magnetic circuit is in a stable operation, a magnetomotive force (MMF) $\dot{F}$ and a magnetic flux $\dot{\Phi}$ in the magnetic circuit;
    S2. solving a magnetic impedance value $Z_{mc}$ and a magnetic impedance angle $\varphi_{mc}$ of the magnetic circuit according to a formula $$\frac{\dot{F}}{\dot{\Phi}} = Z_{mc} \angle \varphi_{mc};$$

S3. solving a reluctance value, a magnetic reactance value, and a magnetic-inductance value of the magnetic circuit respectively according to calculation formulas:

$R_{mc}=Z_{mc}\cos\varphi_m, X_{mc}=Z_{mc}\sin\varphi_{mc}$, and $X_{mc}=\omega L_{mc}$;

wherein $R_{mc}$ represents the reluctance value of the magnetic circuit, $X_{mc}$ represents the magnetic reactance value of the magnetic circuit, $L_{mc}$ represents the magnetic-inductance value, and $\omega$ represents an angular frequency of the magnetic flux varied in the magnetic circuit;
    S4. selecting a reference coordinate system, and drawing a magnetic circuit vector diagram;
    S5. performing an orthogonal decomposition on the MMF $\dot{F}$ in the magnetic circuit with respect to the magnetic flux $\dot{\Phi}$ according to the magnetic circuit vector diagram, to obtain a magnetic voltage drop $\dot{F}_1$ along a direction of the magnetic flux, and a magnetic voltage drop $\dot{F}_2$ along a direction perpendicular to the direction of the magnetic flux;
    S6. calculating virtual magnetic active power of the magnetic circuit according to a formula $P_{mc}=\|\dot{F}_2\|\cdot\|\dot{\Phi}\|$, and calculating virtual magnetic reactive power of the magnetic circuit according to a formula $Q_{mc}=\|\dot{F}_1\|\cdot\|\dot{\Phi}\|$;
    S7. solving virtual magnetic complex power $\dot{S}_{mc}$ of the magnetic circuit according to formulas:

$$\dot{S}_{mc} = \|\dot{S}_{mc}\|\angle\varphi_{mc}, \|\dot{S}_{mc}\| = \sqrt{P_{mc}^2 + Q_{mc}^2}, \text{ and } \varphi_{mc} = \arctan\left(\frac{P_{mc}}{Q_{mc}}\right);$$

and
    S8. solving corresponding electric power according to a conversion factor between the virtual magnetic power of the magnetic circuit and corresponding electric power of an electric circuit, the conversion factor between the virtual magnetic power of the magnetic circuit and the corresponding electric power of the electric circuit being $d\dot{\Phi}/(\dot{\Phi}dt)$ and the conversion factor being $j\omega$ in a case that the MMF and the magnetic flux in the magnetic circuit are sinusoidal, namely:
    electric active power $P_e=\omega P_{mc}$, electric reactive power $Q_e=\omega_{mc}$, and electric complex power $\dot{S}_e=j\omega\dot{S}_{mc}$.

2. The power calculation method of the magnetic circuit according to claim 1, further comprising: before calculating the virtual magnetic active power and the virtual magnetic reactive power of the magnetic circuit in S6, verifying whether a magnetic circuit topology comprising the magnetic-inductance component satisfies magnetic circuit Ohm's law, namely:

$\dot{F}=(R_{mc}+j\omega L_{mc})\dot{\Phi}$;

wherein j represents an imaginary unit, $R_{mc}$ represents the reluctance value of the magnetic circuit, $\omega$ represents the angular frequency of the magnetic flux varied in the magnetic circuit, $L_{mc}$ represents the magnetic-inductance value of the magnetic-inductance component, $\dot{\Phi}$ represents the magnetic flux in the magnetic circuit, and $\dot{F}$ represents the MMF in the magnetic circuit.

3. The power calculation method of the magnetic circuit according to claim 1, wherein a magnitude of the magnetic-inductance value $L_{mc}$ of the magnetic-inductance component is related with a winding number $N_r$ of a short-circuited coil and a resistance value $R_r$ of the short-circuited coil, namely $$L_{mc} = \frac{N_r^2}{R_r},$$

and magnetic-inductance is measured in $\Omega^{-1}$; and the magnetic-inductance component has an obstructive effect on an alternating magnetic flux, but has no obstructive effect on a constant magnetic flux, and an expression for the magnetic reactance value is defined as $X_{mc}=\omega L_{mc}$, to describe the degree of the obstructive effect of the magnetic-inductance component on the alternating magnetic flux, $\omega$ being the angular frequency of the magnetic flux varied in the magnetic circuit.

4. The power calculation method of the magnetic circuit according to claim 1, wherein an equivalent magnetic circuit vector model comprises such four magnetic circuit lumped variables as the MMF $\dot{F}$, the magnetic flux $\dot{\Phi}$, the reluctance value $R_{mc}$, and the magnetic-inductance value $L_{mc}$; and according to the equivalent magnetic circuit vector model, the constructed electromagnetic vector diagram is capable of simultaneously showing phase relationships between electric circuit vectors and magnetic circuit vectors, in a case of linking the equivalent magnetic circuit vector model and an equivalent electric circuit model by using vectors.

5. The power calculation method of the magnetic circuit according to claim 1, wherein with reference to the magnetic circuit vector diagram, an expression for the virtual magnetic complex power of the magnetic circuit is $\dot{S}_{mc}=\dot{\Phi}\cdot\dot{F}^*=\|\dot{F}\|\cdot\|\dot{\Phi}\|e^{-j\varphi_{mc}}=R_{mc}\|\dot{\Phi}\|^2-j\omega L_{mc}\|\dot{\Phi}\|^2=Q_{mc}-jP_{mc}$.

6. The power calculation method of the magnetic circuit according to claim 1, wherein the virtual magnetic active power of the magnetic circuit is defined as an imaginary part of the virtual magnetic complex power, and with reference to the magnetic circuit vector diagram, an expression for the virtual magnetic active power of the magnetic circuit is $P_{mc}=\|\dot{F}\|\cdot\|\dot{\Phi}\| \sin \varphi_{mc}\|\dot{F}_2\|\cdot\|\dot{\Phi}\|=X_{mc}\|\dot{\Phi}\|^2=\omega L_{mc}\|\dot{\Phi}\|^2$.

7. The power calculation method of the magnetic circuit according to claim 1, wherein the virtual magnetic reactive power of the magnetic circuit is defined as a real part of the virtual magnetic complex power, and with reference to the magnetic circuit vector diagram, an expression for the virtual magnetic reactive power of the magnetic circuit is $Q_{mc}=\|\dot{F}\|\cdot\|\dot{\Phi}\| \cos \varphi_{mc}=\|\dot{F}_1\|\cdot\|\dot{\Phi}\|=R_{mc}\|\dot{\Phi}\|^2$.

8. The power calculation method of the magnetic circuit according to claim 1, an expression for the electric active power being:

$$P_e=\omega P_{mc}=\omega\|\dot{F}\|\cdot\dot{\Phi}\| \sin \varphi_{mc}=\omega\|\dot{F}_2\|\|\|\dot{\Phi}\|=\omega X_{mc}\|\dot{\Phi}\|^2=\omega^2 L_{mc}\|\dot{\Phi}\|^2,$$

an expression for the electric reactive power being:

$$Q_e=\omega Q_{mc}=\omega\|\dot{F}\|\cdot\|\dot{\Phi}\| \cos \varphi_{mc}=\omega\|\dot{F}_1\|\cdot\|\dot{\Phi}\|=\omega R_{mc}\|\dot{\Phi}\|^2,$$
and an expression for the electric complex power being: $\dot{S}_e=j\omega \dot{S}_{mc}=\omega P_{mc}+j\omega Q_{mc}=P_e+jQ_e$.

* * * * *